(12) United States Patent
Kub et al.

(10) Patent No.: US 10,589,983 B2
(45) Date of Patent: Mar. 17, 2020

(54) SILICON CARBIDE MICROELECTROMECHANICAL STRUCTURE, DEVICE, AND METHOD

(71) Applicants: The Government of the United States of America, as Represented by the Secretary of the Navy, Arlington, VA (US); The Charles Stark Draper Laboratory, Inc., Cambridge, MA (US)

(72) Inventors: Francis J. Kub, Arnold, MD (US); Karl D. Hobart, Alexandria, VA (US); Eugene A. Imhoff, Washington, DC (US); Rachael L. Myers-Ward, Spriingfield, VA (US); Eugene Cook, Melrose, MA (US); Jonathan Bernstein, Medfield, MA (US); Marc Weinberg, Needham, MA (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 86 days.

(21) Appl. No.: 15/698,604

(22) Filed: Sep. 7, 2017

(65) Prior Publication Data
US 2018/0086625 A1 Mar. 29, 2018

Related U.S. Application Data

(60) Provisional application No. 62/384,449, filed on Sep. 7, 2016.

(51) Int. Cl.
*B81B 3/00* (2006.01)
*B81C 1/00* (2006.01)
(Continued)

(52) U.S. Cl.
CPC .......... *B81B 3/0072* (2013.01); *B81B 7/0016* (2013.01); *B81B 7/0019* (2013.01);
(Continued)

(58) Field of Classification Search
CPC ... B81B 3/0072; B81B 7/0016; B81B 7/0019; B81C 1/00666; G01C 19/56; G01C 19/5621; G01C 19/5656; G01C 19/5733
See application file for complete search history.

(56) References Cited

U.S. PATENT DOCUMENTS 6,306,773 B1 * 10/2001 Adangs ............... B81C 1/00595
257/E21.06
6,788,175 B1 9/2004 Prophet
(Continued)

FOREIGN PATENT DOCUMENTS

WO 2005017975 A3 2/2005

OTHER PUBLICATIONS

Search Report and Written Opinion dated May 23, 2018 in corresponding International Application No. PCT/US2017/050557.

*Primary Examiner* — Peniel M Gumedzoe
(74) *Attorney, Agent, or Firm* — US Naval Research Laboratory; Joslyn Barritt

(57) ABSTRACT

Electromechanical device structures are provided, as well as methods for forming them. The device structures incorporate at least a first and second substrate separated by an interface material layer, where the first substrate comprises an anchor material structure and at least one suspended material structure, optionally a spring material structure, and optionally an electrostatic sense electrode. The device structures may be formed by methods that include providing an interface material layer on one or both of the first and second substrates, bonding the interface materials to the opposing first or second substrate or to the other interface material
(Continued)

layer, followed by forming the suspended material structure by etching.

18 Claims, 6 Drawing Sheets

(51) Int. Cl.
  *G01C 19/5656* (2012.01)
  *G01C 19/5621* (2012.01)
  *G01C 19/56* (2012.01)
  *B81B 7/00* (2006.01)
  *G01C 19/5783* (2012.01)

(52) U.S. Cl.
  CPC .......... *B81C 1/00666* (2013.01); *G01C 19/56* (2013.01); *G01C 19/5621* (2013.01); *G01C 19/5656* (2013.01); *G01C 19/5783* (2013.01); *B81B 2201/0235* (2013.01); *B81B 2201/0242* (2013.01); *B81B 2201/0271* (2013.01); *B81B 2203/0109* (2013.01); *B81B 2203/0118* (2013.01); *B81B 2203/0127* (2013.01); *B81B 2203/0163* (2013.01); *B81B 2203/0307* (2013.01); *B81B 2203/04* (2013.01); *B81C 2201/0132* (2013.01); *B81C 2203/036* (2013.01)

(56) References Cited

U.S. PATENT DOCUMENTS

| | | | |
|---|---|---|---|
| 6,936,492 B2 | 8/2005 | McNeil et al. | |
| 7,637,160 B2 | 12/2009 | Koury et al. | |
| 8,241,931 B1* | 8/2012 | Antoine | B28D 5/00 438/22 |
| 8,499,629 B2 | 8/2013 | Ballas et al. | |
| 8,555,719 B2 | 10/2013 | McNeil et al. | |
| 9,509,278 B2 | 11/2016 | Caffee et al. | |
| 9,562,926 B2 | 2/2017 | Lin et al. | |
| 2004/0113513 A1 | 1/2004 | Borwick, III et al. | |
| 2008/0000297 A1 | 1/2008 | Koury et al. | |
| 2009/0160040 A1* | 6/2009 | Nabki | B81C 1/00246 257/678 |
| 2010/0257934 A1* | 10/2010 | Zhang | G01C 19/5719 73/504.12 |
| 2011/0027930 A1* | 2/2011 | El-Gamal | B81C 1/00301 438/51 |
| 2012/0119842 A1* | 5/2012 | Gu | H03H 7/40 333/17.3 |
| 2014/0230547 A1* | 8/2014 | El-Gamal | G01C 19/5698 73/504.12 |
| 2014/0264385 A1* | 9/2014 | Massimo | H01L 21/02381 257/77 |
| 2014/0266509 A1 | 9/2014 | Caffee et al. | |
| 2015/0344297 A1* | 12/2015 | Chou | G01P 15/125 438/53 |
| 2017/0022049 A1 | 1/2017 | Chu et al. | |

* cited by examiner

SILICON CARBIDE MICROELECTROMECHANICAL STRUCTURE, DEVICE, AND METHOD

CROSS-REFERENCE TO RELATED APPLICATIONS

This application claims priority to U.S. Provisional Application No. 62/384,449, filed on Sep. 7, 2016, the contents of which are incorporated herein by reference in their entirety.

TECHNICAL FIELD

This application relates generally to silicon carbide (SiC) electromechanical device structures, and methods for forming them. The device structures incorporate at least a first and second substrate separated by an interface, where the first substrate comprises an anchor material structure and at least one suspended material structure, optionally a spring material structure, and optionally an electrostatic sense electrode. The electromechanical device structures may be formed by methods that include providing an interface material layer on one or both of the first and second substrates, bonding the interface material(s) to the opposing first or second substrate or to the other interface material layer, followed by forming the suspended material structure by etching.

BACKGROUND OF THE INVENTION

3C-SiC is often used for microelectromechanical system (MEMS) device structures. 3C-SiC material layers grown on silicon second substrates typically have high residual stress, high dislocation density, and high surface roughness. The 3C-SiC material layers can be grown on silicon second substrates with an (100) orientation surface or an (111) orientation surface. However, there is significant thermal expansion mismatch between the 3C-SiC epitaxial layer and a silicon second substrate, and the 3C-SiC has high built-in strain, many defects, and is typically less than 2 microns thick.

SiC beams have been fabricated using photoelectrochemical selective etching, but the resulting beam thickness has been limited to approximately 1 micron. SiC beams have also been fabricated using hydrogen ion implantation and splitting, but the hydrogen ion implantation limits the SiC beam thickness to approximately 1 micron.

U.S. Pat. No. 6,788,175 is directed to an anchor system for securing a MEMS device to a substrate comprising multiple anchors. A MEMS structure, built in accordance with the one embodiment of the invention, comprises a flexible beam suspended over a substrate and a base attached to each end of the beam. Each base is supported above the substrate by multiple anchors attached to the surface of the substrate. Each anchor further comprises anchor legs along its sides that support the base off of the substrate. In one embodiment, the anchors of each base are located away from the interface between the beam and the base. In another embodiment, the lengths of the anchor legs of the anchors are made longer along a direction of good side-wall step coverage than along a direction of poor side-wall step coverage.

U.S. Pat. No. 6,936,492 is directed to a transducer which comprises an unbalanced proof mass, and which is adapted to sense acceleration in at least two mutually orthogonal directions. The proof mass has first and second opposing sides that are of unequal mass.

U.S. Pat. No. 7,637,160 is directed to a MEMS device that has a sensitivity to a stimulus in at least one sensing direction, which includes a substrate, a movable mass with corner portions suspended in proximity to the substrate, at least one suspension structure coupled approximately to the corner portions of the movable mass for performing a mechanical spring function, and at least one anchor for coupling the substrate to the at least one suspension structure. The at least one anchor is positioned approximately on a center line in the at least one sensing direction.

U.S. Pat. No. 8,499,629 is directed to a mounting system for a MEMS device includes a proof mass selectively coupled to a substrate using a centrally located, single anchor mount that minimizes sensitivity to strain variations experienced by the MEMS device. The mounting system may include isolation cuts arranged in the proof mass to advantageously achieve a desired amount of strain isolation and to produce hinges that extend in opposite directions from the anchor mount. The single anchor mount is arranged to reduce a separation distance from a mid-point or centroid of the anchor mount to its perimeter as compared to conventional mounting schemes that have multiple anchor mounts positioned distally from a common mid-point.

U.S. Pat. No. 8,555,719 is directed to a microelectromechanical systems (MEMS) sensor including a substrate and a suspension anchor formed on a planar surface of the substrate. A first folded torsion spring and a second folded torsion spring interconnect the movable element with the suspension anchor to suspend the movable element above the substrate. The folded torsion springs are each formed from multiple segments that are linked together by bar elements in a serpentine fashion. The folded torsion springs have an equivalent shape and are oriented relative to one another in rotational symmetry about a centroid of the suspension anchor.

U.S. Pat. No. 9,509,278 is directed to a MEMS device including a resonator suspended from a substrate, an anchor disposed at a center of the resonator, a plurality of suspended beams radiating between the anchor and the resonator, a plurality of first electrodes disposed about the anchor, and a plurality of second electrodes disposed about the anchor. The plurality of first electrodes and the resonator form a first electrostatic transducer. The plurality of second electrodes and the resonator form a second electrostatic transducer. The first electrostatic transducer and the second electrostatic transducer are configured to sustain rotational vibrations of the resonator at a predetermined frequency about an axis through the center of the resonator and orthogonal to a plane of the substrate in response to a signal on the first electrode.

U.S. Pat. No. 9,562,926 is directed to a MEMS device including a substrate, a proof mass, a spring, a spring anchor, a first electrode anchor, and a second electrode anchor, a first fixed electrode, and a second fixed electrode. The proof mass is connected to the substrate through the spring and the spring anchor. The proof mass includes a hollow structure inside, and the spring anchor, the first electrode anchor, and the second electrode anchor are located in the hollow structure. The proof mass and the first fixed electrode form a first capacitor, and the proof mass and the second fixed electrode form a second capacitor. There is neither any portion of the proof mass nor any portion of any fixing electrode located between the first electrode anchor, second electrode anchor, and the spring anchor.

The contents of these prior patents are hereby incorporated by reference in their entirety.

The hexagonal SiC electromechanical device structures of the invention, and methods for forming them, beneficially exhibit good thermal expansion matching, and low capacitance. They also provide higher modulus, higher density, superior isoelasticity, improved radiation hardness, higher stiffness, higher fracture toughness, higher shock resistance, and higher thermal conductivity than silicon. This allows the device structures of the invention to achieve well-controlled device characteristics over a range of temperatures, and the electromechanical hexagonal SiC device structures are particularly advantageous in high-gravitational-force (G-force) applications, and in applications requiring radiation hardness.

SUMMARY OF THE INVENTION

The invention described herein, including the various aspects and/or embodiments thereof, meets the unmet needs of the art, as well as others, by providing electromechanical device structures, and methods for forming them. The electromechanical device structures incorporate at least a first and second substrate separated by an interface, where the first substrate comprises an anchor material structure and at least one suspended material structure, optionally a spring material structure, and optionally an electrostatic sense electrode. In some embodiments, the electromechanical device structures incorporate at least a first and second substrate separated by an interface, where the first substrate comprises an anchor material structure and at least one suspended mass material structure, optionally a spring material structure (flexural material structure) connecting the suspended mass beam to anchor, and optionally a electrostatic sense electrode. The suspended mass material structure may be a suspended proof mass structure. The suspended mass material structure may be a resonator. The flexural beam may be a folded flexural member providing a mechanical spring function. The device structures may be formed by methods that include providing a dielectric interface material layer on one or both of the first and second substrates, bonding the interface material(s) to the opposing first or second substrate or to the other interface material layer, followed by forming the suspended material structure by etching.

In one aspect of the invention, an electromechanical device structure includes a first substrate comprising silicon carbide, wherein the first substrate is etched to form an anchor material structure and a suspended material structure; a second substrate; and an interface material layer provided between the first and second substrates.

According to another aspect of the invention, a method for forming an electromechanical device structure includes providing a first substrate; providing a second substrate; providing an interface material layer on one or both of the first and second substrates; bonding the interface material layer to an opposing first or second substrate or to the other interface material layer; and etching the first substrate, forming an anchor material structure and a suspended material structure.

Other features and advantages of the present invention will become apparent to those skilled in the art upon examination of the following or upon learning by practice of the invention.

DETAILED DESCRIPTION OF EMBODIMENTS OF THE INVENTION

Figure 1:
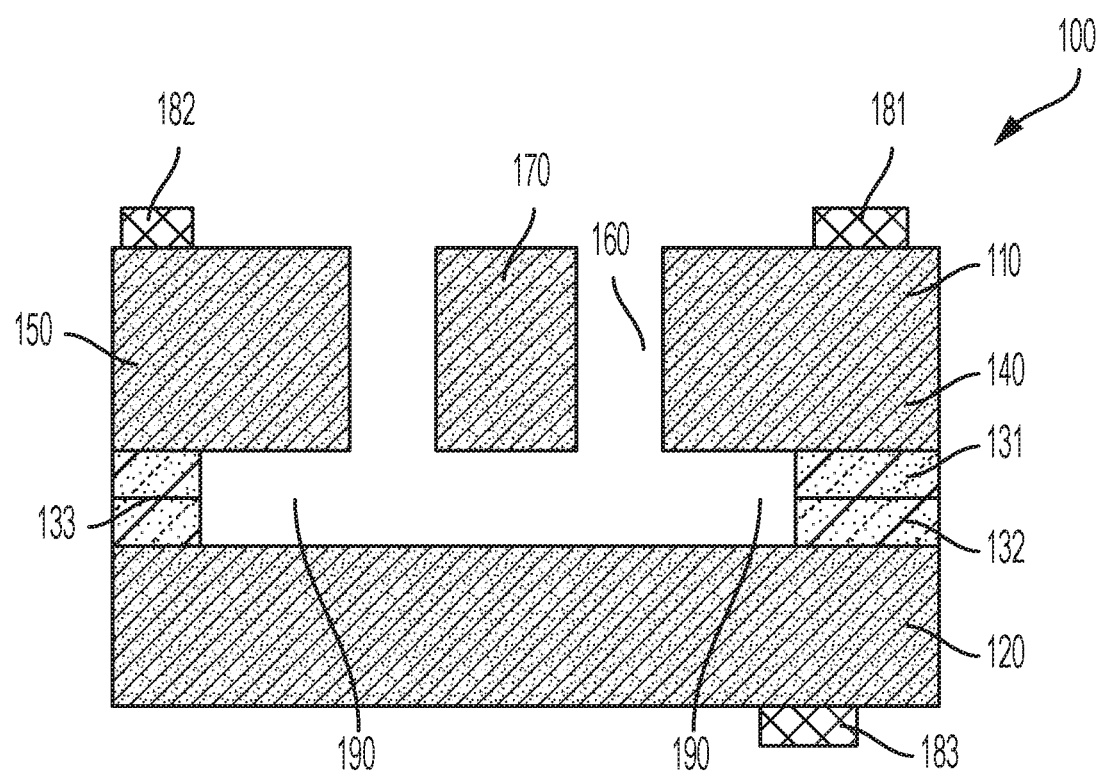
FIG. 1 is a side view of a hexagonal, single-crystal SiC device structure formed from a first substrate that is attached (bonded) to a second substrate, with an interface material layer between an anchor material structure and an electrostatic sense electrode structure and the second substrate.

The invention described herein, including the various aspects and/or embodiments thereof, meets the unmet needs of the art, as well as others, by providing electromechanical device structures, including microelectromechanical system (MEMS) device structures and nanoelectromechanical system (NEMS) device structures, and methods for forming them. The device structures incorporate at least a first and a second substrate separated by an interface, where the first substrate comprises an anchor material structure and at least one suspended material structure, and optionally an electrostatic sense electrode. The device structures may be formed by methods that include providing an interface material layer on one or both of the first and second substrates, bonding the interface material(s) to the opposing first or second substrate or to the other interface material layer, followed by forming the suspended material structure by etching.

Materials

The silicon carbide (SiC) electromechanical structures of the invention include a second substrate, a first substrate, and an interface provided between the first and second substrates. The first substrate is formed from a material that may be etched to form an anchor material structure and a suspended material structure, optionally a spring material structure, and optionally an electrostatic sense electrode material structure.

The SiC electromechanical structures of the invention beneficially provide a higher modulus, higher density, and higher thermal conductivity than similar silicon devices. These improved properties are particularly desirable in MEMS and NEMS devices. In addition, SiC provides superior isoelasticity (rotation symmetry) compared to silicon, thereby reducing errors in MEMS gyroscope functioning. SiC also provides higher stiffness and fracture resistance than silicon, improving shock resistance in high-G applications. SiC also exhibits improved radiation hardness compared to silicon. When SiC is wafer bonded to SiC, good thermal expansion matching is achieved, providing low strain versus temperature.

Second Substrate

The second substrate may be electrically conductive, optionally with N-type doping or P-type doping. The second substrate may be an electrically-conductive N-type hexagonal single-crystal SiC, or an electrically-conductive P-type hexagonal single crystal SiC. The second substrate may also be formed from materials that include, but are not limited to, a single-crystal hexagonal SiC, silicon, glass, ceramic (including an electrically-conductive ceramic), and an electrically-conductive polycrystalline substrate material. Silicon carbide second substrates, including but not limited to single-crystal 4H-SiC, single-crystal 6H-SiC, and polycrystalline SiC, may have properties including high mechanical strength, and high thermal conductivity (>300 W/mK). Electrically conductive SiC second substrates beneficially prevent charge buildup on the surface, which can cause electrical non-uniformities.

The second substrate may include, but not be limited to, a high temperature compatible second substrate, a linear coefficient of thermal expansion of the second substrate that is matched to the linear coefficient of thermal expansion of the first substrate, high mechanical strength second substrate, high thermal conductivity second substrate, a matched thermal conductivity second substrate, a low total thickness variation (TTV) second substrate, a second substrate with low total thickness variation (TTV) and also a low thickness uncertainty, a low surface roughness second substrate, an electrically-conductive second substrate, a second substrate with N-type or P-type doping regions in the second substrate, a low cost second substrate, and combinations thereof. The second substrate properties may include but not be limited to a single-crystal second substrate, a non-crystalline second substrate, a semiconductor second substrate, a ceramic second substrate, polycrystalline second substrate, or a metal second substrate.

It is desirable that the second substrate have at least an electrical conductivity to prevent the buildup of localized charge regions on the first surface (top) of the second substrate resulting from formation ions and electrons on the first surface due to a high surface resistivity. The electrical conductivity in the second substrate will conduct the ions and electrons into the substrate and also distribute the ions and electrons uniformly on the second surface (bottom) to prevent the buildup of localized charge regions. The second substrate is also used to provide an equipotential surface region for the suspended beams that are formed above the second substrate and conduct displacement currents.

In some embodiments, it is desirable that the second substrate have a resistivity less than 1000 ohm-cm. In some embodiments, it is desirable that the second substrate has a resistivity less than 100 ohm-cm. In some embodiments, it is desirable that the second substrate has a resistivity less than 10 ohm-cm. In some embodiments, it is desirable that the second substrate has a resistivity less than 1 ohm-cm. In some embodiments, it is desirable that the second substrate has a resistivity less than 0.1 ohm-cm. In some embodiments, it is desirable that the second substrate has a resistivity less than 0.05 ohm-cm. In some embodiments, it is desirable that the second substrate has a resistivity less than 0.02 ohm-cm. In some embodiments, it is desirable that the second substrate has a resistivity less than 0.01 ohm-cm.

Another aspect is that the hexagonal single-crystal SiC material first substrate that is used to form the suspended material structure can be bonded on a second substrate with an approximately matched linear coefficient of thermal expansion. An advantage of having a second substrate with a linear coefficient of expansion that about matches the linear thermal expansion coefficient of the hexagonal single-crystal SiC first substrate material layer is that the matched linear coefficients of expansion facilitate the wafer bonding of the two material layers. Material layers with different thermal expansion coefficient can debond, crack and have significant wafer bow during higher temperature processes (such as annealing to increase the bond strength or growth of a thermal oxide layer). The 4H-SiC, 6H-SiC and CVD polycrystalline second substrate may approximately match the linear thermal coefficient of expansion of the hexagonal signal crystal SiC layer used to form the suspended material structure. Thus, very thick 4H-SiC or 6H-SiC material layers can be bonded without extensive second substrate or wafer bow. For example, the 4H-SiC or 6H-SiC material layer may be about 40 microns thick in some embodiments, about 100 microns thick in some embodiments, about 200 microns thick in some embodiments, and about 500 microns thick in some embodiments.

The linear thermal expansion coefficient of the second substrate may have a value that is within about 0.5 percent of the linear thermal expansion coefficient of the hexagonal single-crystal SiC first substrate. In some embodiments, the linear thermal expansion coefficient of the second substrate is within about 1.0 percent of the linear thermal expansion coefficient of the hexagonal single-crystal SiC first substrate. In some embodiments, the linear thermal expansion coefficient of the second substrate is within about 10 percent of the linear thermal expansion coefficient of the hexagonal single-crystal SiC first substrate. In some embodiments, the linear thermal expansion coefficient of the second substrate is within about 20 percent of the linear thermal expansion coefficient of the hexagonal single-crystal SiC first substrate. In some embodiments, the linear thermal expansion coefficient of the second substrate is within about 50 percent of the linear thermal expansion coefficient of the hexagonal single-crystal SiC first substrate.

In some embodiments, it is desirable that the second substrate and the first substrate (from which the suspended material structure, anchor material structure, and the electrostatic sense electrode material structure are formed) are both hexagonal, single-crystal SiC substrates. The advantages include good thermal expansion match, high modulus device structure, and high thermal shock resistant structure. The good thermal expansion match is desirable for well controlled device characteristics over temperature. A high-modulus device structure formed using hexagonal, single-crystal SiC as the first and second substrates is particularly advantageous for high-G applications.

Interface Material Layer

One or more interface material layers may be provided between the second substrate and the first substrate. In some embodiments, the interface material layer may comprise a first interface material layer formed on the second surface (bottom) of the anchor material structure (and the electrostatic sense electrode material structure) and a second interface material layer formed on the first surface (top) of the second substrate, with the second surface (bottom) of the first interface material layer directly wafer bonded (fusion bonded) to the first surface (top) of the second interface layer.

In some embodiments that do not have a first interface material layer, the interface material layer may comprise the second interface material layer with the second surface of the anchor material structure (and the electrostatic sense electrode material structure) bonded to the first surface of the second interface material layer. In some embodiments that do not have a second interface material layer, the interface material layer may comprise the first interface material layer with the first surface of the second substrate bonded to the second surface of the first interface material layer.

The interface material layer(s) can be formed of materials that include, but are not limited to, dielectric, insulator, silicon oxide, silicon nitride, polysilicon, spin-on glass, low-K dielectric materials, polymers, and combinations thereof. The interface material layer can have the properties of being electrically insulating, having low surface roughness (i.e., less than about 0.5 nm RMS, which can be achieved by chemically or mechanically polishing the surface as necessary), being thermally conductive to minimize temperature gradients in a microelectromechanical device, and/or being laterally undercut to facilitate the fabrication of a movable suspended material structure.

The first interface material layer and the second interface material layer may have a dielectric constant less than about 3.0. Low-K materials typically has a dielectric constant of about 3.0. The first interface material layer and the second interface material layer may have a dielectric constant less than about 4.0. Silicon dioxide typically has a dielectric constant of about 3.9. The first interface material layer and the second interface material layer may have a dielectric constant less than about 6.5. Silicon nitride typically has a dielectric constant of about 7-8.

The interface material layer can absorb hydrogen, which is advantageous for direct wafer bonding (fusion wafer bonding). The interface material layer(s) can have a surface roughness of less than about 0.5 nm RMS, which is also advantageous for direct wafer bonding (fusion wafer bonding). The surface of the interface material layer(s) can be chemically or mechanically polished to reduce the surface roughness to less than about 0.5 nm RMS.

The interface material layers can be laterally undercut to enable a movable suspended material structure. In the case of a silicon oxide interface material layer, processes such as HF vapor etching, anhydrous HF vapor etching, and wet chemical dilute HF etching may be used. In the case of a polysilicon interface material layer, processes such as xenon difluoride ($XeF_2$) or wet chemical etch may be used to laterally undercut the interface material layer to provide a movable suspended material structure. In the case that a liquid chemical etch process is used to undercut the interface material layer(s), it is desirable to use critical point drying to prevent stiction where the suspended beam structure attaches to the second substrate and is no longer capable of freely moving.

It is desirable to reduce the capacitance between the electrostatic sense electrode material structure and the second substrate. The capacitance can be reduced by utilizing a thick interface material layer.

In some embodiments, the interface material layer may have a thickness greater than about 0.5 microns to reduce the capacitance of the electrostatic sense electrode material structure to the second substrate. In some embodiments, the interface material layer may have a thickness greater than about 1.0 micron to reduce the capacitance of the electrostatic sense electrode material structure to the second substrate. In some embodiments, the interface material layer may have a thickness greater than about 1.5 microns to reduce the capacitance of the electrostatic sense electrode material structure to the second substrate. In some embodiments, the interface material layer may have a thickness greater than about 2.0 microns to reduce the capacitance of the electrostatic sense electrode material structure to the second substrate. In some embodiments, the interface material layer may have a thickness greater than about 2.5 microns to reduce the capacitance of the electrostatic sense electrode material structure to the second substrate. In some embodiments, the interface material layer may have a thickness greater than about 3.0 microns to reduce the capacitance of the electrostatic sense electrode material structure to the second substrate. In some embodiments, the interface material layer may have a thickness greater than about 4.0 microns to reduce the capacitance of the electrostatic sense electrode material structure to the second substrate. In some embodiments, the interface material layer may have a thickness greater than about 5.0 microns to reduce the capacitance of the electrostatic sense electrode material structure to the second substrate. In some embodiments, the interface material layer may have a thickness greater than about 6.0 microns to reduce the capacitance of the electrostatic sense electrode material structure to the second substrate. In some embodiments, the interface material layer may have a thickness greater than about 10.0 microns to reduce the capacitance of the electrostatic sense electrode material structure to the second substrate. In some embodiments, the interface material layer may have a thickness greater than about 20.0 microns to reduce the capacitance of the electrostatic sense electrode material structure to the second substrate. In some embodiments, the interface material layer may have a thickness greater than about 40.0 microns to reduce the capacitance of the electrostatic sense electrode material structure to the second substrate.

Preferably, an interface material layer is provided that has a composition and thickness sufficient to achieve low capacitance between the conductive sense electrode structure. The low capacitance may be a parallel capacitance of from about 1-10 pF, preferably about 5 pF. A low parasitic capacitance beneficially results in low noise in the device.

The interface material layer may be undercut beneath the sense electrode material layer to reduce the effect area of the electrostatic sense electrode. In some embodiments, the lateral undercut may be about 10 microns. In some embodiments, the lateral undercut may be about 20 microns. In some embodiments, the lateral undercut may be about 30 microns.

The area of the electrostatic sense electrode may be reduced by the choice of the electrode attachment method. The area of the sense electrode contact are for wire bonding is typically about 30 microns×30 microns. The area of the sense electrode contact area for flip chip bonding can be in the range of about 20 microns×20 microns to about 3 micron×3 microns for flip chip bonding.

First Substrate

The first substrate may comprise SiC, and may be etched in order to form a suspended material structure, an anchor material structure, an optional spring material structure, and an optional electrostatic sense electrode structure. The first substrate is preferably formed from a hexagonal single-crystal SiC material, and is more preferably a hexagonal, single-crystal 6H-SiC material or a hexagonal single-crystal 4H-SiC material. The thickness of the hexagonal single-crystal SiC used as the first substrate may be in the range of about 50 nm to 200 microns, and is preferably more than about 2 microns thick.

In some embodiments, it is desirable that the first substrate have a resistivity less than 1000 ohm-cm. In some embodiments, it is desirable that the second substrate has a resistivity less than 100 ohm-cm. In some embodiments, it is desirable that the second substrate has a resistivity less than 10 ohm-cm. In some embodiments, it is desirable that the second substrate has a resistivity less than 1 ohm-cm. In some embodiments, it is desirable that the second substrate has a resistivity less than 0.1 ohm-cm. In some embodiments, it is desirable that the second substrate has a resistivity less than 0.05 ohm-cm. In some embodiments, it is desirable that the second substrate has a resistivity less than 0.02 ohm-cm. In some embodiments, it is desirable that the second substrate has a resistivity less than 0.01 ohm-cm.

SiC materials also offer the benefit of being extremely radiation hard, due to the large displacement energy for atom displacement of 21.8 eV. The number of atomic displacements created by an energetic ion, according to the Kinchin-Pease formula, is inversely proportional to the displacement energy.

Hexagonal single-crystal SiC first substrates can have a silicon face (0001) or a carbon face (000-1)(overbar). In some embodiments, the first hexagonal single-crystal substrate may have an orientation that is about on-axis. In some embodiments, the hexagonal single-crystal SiC first substrate has about on-axis orientation with respect to the (0001) c-axis. In some embodiments, the hexagonal single-crystal SiC first substrate has less than about 0.5 degrees orientation from the (0001) c-axis. In some embodiments, the hexagonal single-crystal SiC first substrate has less than about 1.0 degrees orientation from the (0001) c-axis. In some embodiments, the hexagonal single-crystal SiC first substrate has less than about 2.0 degrees orientation from the (0001) c-axis. In some embodiments, the hexagonal single-crystal SiC first substrate has less than about 4.0 degrees orientation from the (0001) c-axis. In some embodiments, the hexagonal single-crystal SiC first substrate has less than about 8.0 degrees orientation from the (0001) c-axis.

In some embodiments, the hexagonal single-crystal SiC first substrate has about on-axis orientation with respect to the (000-1)(overbar) c-axis. In some embodiments, the hexagonal single-crystal first substrate has an orientation that is about on-axis. In some embodiments, the hexagonal single-crystal SiC first substrate has about on-axis orientation with respect to the (000-1) (overbar) c-axis. In some embodiments, the hexagonal single-crystal SiC first substrate has less than about 0.5 degrees orientation from the (000-1) (overbar) c-axis. In some embodiments, the hexagonal single-crystal SiC first substrate has less than about 1.0 degrees orientation from the (000-1)(overbar) c-axis. In some embodiments, the hexagonal single-crystal SiC first substrate has less than about 2.0 degrees orientation from the (000-1)(overbar) c-axis. In some embodiments, the hexagonal single-crystal SiC first substrate has less than about 4.0 degrees orientation from the (000-1)(overbar) c-axis. In some embodiments, the hexagonal single-crystal SiC first substrate has less than about 8.0 degrees orientation from the (000-1)(overbar) c-axis.

By orienting the first substrate to be on-axis with respect to the [0001] plane, good isoelasticity (rotation symmetry) may be achieved, which is particularly beneficial when the structure is used in the fabrication of gyroscope devices. For a typical 0.01 radian alignment error, the stiffness (Young's modulus) of a 4H-SiC substrate varies by 0.007% ($\Delta f=35$ ppm). This compares very favorably to silicon substrates oriented with respect to the [111] plane, where a 0.01 radian alignment error results in stiffness varying by 0.9% ($\Delta f=4500$ ppm).

The fixed oxide charge on the surface of SiC is typically a positive fixed oxide charge. Thus, the surface of N-type SiC is typically accumulated, while the surface of P-type SiC can be inverted or depleted. A high surface state density on the exposed surfaces of the SiC can degrade the "Q" of microelectromechanical devices, and it can be desirable to reduce the surface state density. The surface state density on the surface of SiC can be reduced using approaches such as annealing oxides, or growing oxides formed on the surface of SiC in nitrogen-containing ambients (such as nitrous oxide) at high temperatures. The surface state density of SiC can also be lowered by growth of layers of lanthanum-doped oxide, barium-doped oxides, or strontium-doped oxides. Methods for growing passivation layers on exposed surfaces of SiC include, but are not limited to, dry thermal oxidation, wet thermal oxidation, combinations of dry and wet thermal oxidation, atomic layer deposition, molecular vapor deposition, chemical vapor deposition, and glow discharge.

The suspended material structure (e.g., beams, membranes, cantilevers, bridges), the anchor material structure, the spring material structure, and the sense electrode material structure may be formed using materials that include, but are not limited to, bulk hexagonal single-crystal SiC material or epitaxial hexagonal single-crystal SiC material or a layered combination of bulk and epitaxial hexagonal single-crystal SiC material.

In some embodiments, it is desirable that the second substrate and the first substrate (from which the suspended material structure, anchor material structure, spring material structure, and the sense electrode material structure are formed) are both hexagonal, single-crystal SiC materials. The advantages include good thermal expansion match, high modulus device structure, and high thermal shock resistant structure. The good thermal expansion match is desirable for well controlled device characteristics over temperature. A high-modulus device structure formed using hexagonal, single-crystal SiC as the first and second substrates is particularly advantageous for high-G applications.

For many applications, it is advantageous for the suspended material structure that forms a suspended beam be thicker to have a higher mass in the suspended beam that enables a lower Brownian mechanical noise. The Brownian noise corresponds to an equivalent acceleration noise of $$A_n^2 = (4k_B Tb)/m^2$$

where $k_B$ is the Boltzman's constant, T is the temperature in Kelvin, and b is the damping coefficient, and m is the proof mass. A suspended material structure with a thickness in the range of about 1 micron to 500 microns can be formed by wafer bonding a bulk hexagonal single-crystal SiC second substrate and then thinning to selected thickness. This is to be contrasted with the thickness capability for cubic single-crystal 3C-SiC. Cubic single-crystal 3C-SiC is typically grown on a silicon substrate and is limited to a thickness less than 20 microns, and has high levels of residual stress and high levels of defects.

Thick suspended material structures enable MEMS devices to achieve higher structural densities and higher sensitivities. Device thickness is directly proportional to the force and voltage applied. Increasing the device thickness provides the opportunity to reduce the voltage, or achieve greater capacitive sensitivity. In addition, thick suspended material structures are less susceptible to surface effects (e.g., surface states and surface passivation), and have lower surface energy loss and higher Q.

A hexagonal single-crystal SiC suspended material structure in the range of about 50 nm to 500 microns thick can be formed using a wafer bonding and hydrogen ion material splitting approach. In some embodiments, a hexagonal single-crystal SiC suspended material structure can be 50 nm thick. In some embodiments, a hexagonal single-crystal SiC suspended material structure can be about 100 nm thick. In some embodiments, a hexagonal single-crystal SiC suspended material structure can be 500 nm thick. In some embodiments, a hexagonal single-crystal SiC suspended material structure can be 1 micron thick. In some embodiments, a hexagonal single-crystal SiC suspended material structure can be 2 microns thick. In some embodiments, a hexagonal single-crystal SiC suspended material structure can be 4 microns thick. In some embodiments, a hexagonal single-crystal SiC suspended material structure can be about 10 microns thick. In some embodiments, a hexagonal single-crystal SiC suspended material structure can be 20 micron thick. In some embodiments, a hexagonal single-crystal SiC suspended material structure can be about 40 microns thick. In some embodiments, a hexagonal single-crystal SiC suspended material structure can be about 100 microns thick. In some embodiments, a hexagonal single-crystal SiC suspended material structure can be about 200 microns thick. In some embodiments, a hexagonal single-crystal SiC suspended material structure can be 500 microns thick.

It is desirable that the suspended material structure have low residual stress or strain, and relatively low induced stress or strain from changes in operation temperature. The hexagonal single-crystal SiC suspended material structure may be formed by thinning a bonded hexagonal single-crystal SiC first substrate after wafer bonding. One approach to reduce the residual stress and subsurface damage at the first surface (top) of the suspended material structure during the thinning operation is to use a stress release chemical mechanical polish (CMP) and/or a plasma etch process. In some optional embodiments, a spring material structure may be provided to connect the anchor material structure to the suspended material structure. In addition, the stress in the hexagonal single-crystal suspended material structure as the operation temperature changes can be minimized by using a SiC second substrate, so that the linear coefficient of thermal expansion is about equal for both the second substrate and the hexagonal single-crystal suspended material structure. A significant advantage of the use of bulk hexagonal single-crystal SiC material for the suspended material structure and the anchor structure is that bulk hexagonal single-crystal SiC can have residual stress less than about 100 MPa in some embodiments, can have residual stress less than about 20 MPa in some embodiments, can have residual stress less than about 10 MPa in some embodiments, and can have residual stress less than about 5 MPa in some embodiments. This is contrasted with 3C-SiC, which typically has a residual stress greater than 400 MPa.

It is desirable that the suspended material structure be mechanically anchored in a manner that reduces or eliminates transfer of strain from the second substrate into the suspended material structure so that the electromechanical device, MEMS, NEMS, or transducer is strain-tolerant. The technique includes using an electrically-insulating interface material layer for mechanical coupling and electrical isolation. The transfer of strain from the second substrate can be minimized by using a SiC second substrate so that the linear coefficient of thermal expansion is about equal for both the second substrate and the hexagonal single-crystal suspended material structure as the operation temperature changes.

An advantage of hexagonal single-crystal SiC material for the suspended material structure and the anchor material structure is that hexagonal, single-crystal SiC materials have a dislocation density less than about $1 \times 10^5$ cm$^{-2}$. S. A. Salwe, et al., "Bulk growth of SiC—review on advances of SiC vapor growth for improved doping and systematic study on dislocation evolution," *Silicon Carbide*, Vol. 1: GROWTH, DEFECTS, AND NOVEL APPLICATIONS, edited by P. Friedrichs, et al. (2010). The values for the (0006) X-ray rocking curve were less than about 0.135 degrees FWHM and about 0.047 degrees FWHM for high temperature growth. Other reports indicate a dislocation density of less than $1 \times 10^4$ cm$^{-2}$ K. Ornate, "Crystal defect in SiC wafers and a new X-ray topography system," *The Rigoku Journal*, 29(1):1-8 (2013), and T. Paskova, NITRIDES WITH NONPOLAR SURFACES: GROWTH PROPERTIES AND DEVICES, page 76. While not available commercially, the best reported dislocation density for bulk hexagonal SiC is about $1 \times 10^2$ cm$^{-2}$ (D. Nakamur, et. al., "Ultrahigh-quality Silicon Carbide Single-Crystals," *Nature* 430:1009 (2004)). A low dislocation density is desirable to reduce mechanical loss in suspended material structures and achieve high "Q" values. This is contrasted with cubic, single-crystal 3C-SiC, which has high levels of dislocation density because of growth on lattice-mismatched silicon second substrates.

The hexagonal single-crystal SiC suspended material structure, the anchor material structure, optional spring material structure, and the optional sense electrode material structure may be doped N-type or P-type. The doping concentration in the hexagonal single-crystal suspended material structure and anchor structure may be selected for a low doping concentration for some applications, or for high doping concentrations in other applications. For example, a high doping concentration in the hexagonal single-crystal suspended material structure would be preferred for a capacitive accelerometer. The high doping concentration can be in the range of about $1 \times 10^{16}$ cm$^{-3}$ to about $1 \times 10^{20}$ cm$^{-3}$ doping concentration. A doping concentration of about $1 \times 10^{18}$ cm$^{-3}$ facilitates the formation of ohmic contact to the N-type hexagonal single crystal substrate. A low doping concentration would be preferred for a suspended material structure. For example, a low doping concentration would be preferred for a suspended material structure in the case of a thermally-actuated MEMS oscillator, in which case the suspended material structure can perform as a resistive thermal actuator. The low doping concentration can be in the range from about $5 \times 10^{13}$ cm$^{-3}$ to about $1 \times 10^{18}$ cm$^{-3}$ to provide a resistor that can be used for thermal actuation. There can be laterally patterned selected doping regions in the first and/or second surface of the hexagonal single-crystal SiC suspended material structure and anchor material structure formed by ion implantation and annealing of dopants, or alternately by diffusion of dopants.

The suspended material structure beam can be widely applied to a variety of sensors. For example, a variable capacitor may be simply formed by adjusting the distance between two adjacent suspended beams. In this way, a MEMS sensor (e.g., an accelerometer) can be fabricated. The suspended material structure may be comprise a suspended hexagonal-SiC material layer structure that is single-clamped or double-clamped to SiC material layer structure (s) that is/are connected to an anchor.

It is desirable to decouple suspended material structures from sources of strain by forming suspended material structure that are mechanically-anchored in a manner that reduces or eliminates transfer of strain from the second substrate into the suspended material structure so that a transducer is strain-tolerant. The technique includes using an electrically-insulating interface material layer for mechanical coupling and for electrical isolation, as well as using a hexagonal single-crystal SiC material having a high modulus.

It is desirable that the parasitic capacitance of the sense electrode material structure (when provided) to the second substrate be minimized to reduce the noise at the input to an amplifier that is connected to the sense electrode material structure. The noise at the input to the amplifier is proportion to the capacitance on the sense electrode material structure. Thus, it is desirable the sense electrode material structure capacitance be minimized. The interface material thickness and dielectric constant can be selected to minimize sense electrode capacitance to the second substrate. The sense electrode capacitance to the second substrate is approximately inversely proportional to the thickness of the interface material layer. The sense electrode capacitance to the second substrate is approximately inversely proportional to the dielectric constant of the interface material layer. The sense electrode capacitance to the second substrate is approximately proportional to the area of the sense electrode. The interface material layer can be laterally undercut beneath the sense electrode to reduce the effective area of the sense electrode, but some amount of interface material is desirable beneath the sense electrode to mechanically support the sense electrode and in some embodiments, to allow wire bonding or other electrical connection methods to the sense electrode material structure.

Devices

The structures and materials of the invention may be used to prepare a variety of electromechanical device structures having differing configurations. MEMS and NEMS device structures including, but not limited to, gyroscopes, accelerometers, oscillators, and inertial sensors may be provided. The devices are suitable for use in environments where they may be subjected to high levels of radiation or high-G applications.

In some electromechanical devices, the actuation or sensing can be by electrostatic coupling. The electrostatic coupling between the suspended material structure and the anchor material structure is dependent on the width of the trench etched region and the sidewall angle of the trench region.

The sidewall angle of the deep trench can be in the range of about 3 degrees to 15 degrees off of the vertical axis. The aspect ratio of the deep trench can be in the range of greater than 5 to 1 to greater than 100 to 1. The width of the trench can be as small as about 0.5 microns or as large as about 5 to 8 microns. The width of the deep trench can be about 1 micron for a suspended material structure than is less than about 10 microns thick. The width of the deep trench can be about 2 micron for a suspended material structure than is less than about 20 microns thick. The width of the deep trench can be about 3 micron for a suspended material structure than is less than about 40 microns thick. The width of the deep trench can be about 4 micron for a suspended material structure than is less than about 60 microns thick.

Electrostatic coupling to a 4H-SiC beam typically requires that the beam have an electrical conductivity, and thus it is typically preferred that the 4H-SiC material be doped N-type with a doping concentration in the range of $5 \times 10^{18}$ cm−3 to $1 \times 10^{19}$ cm−3. Commercial 4H-SiC second substrates can be N-type.

Electromechanical Structures Including Sense Electrode

In one embodiment, a device structure may include one or more than one hexagonal single-crystal SiC suspended material structure(s) attached to one or more than one hexagonal single-crystal SiC anchor material structure(s) attached (bonded) to an electrically conductive second substrate. An interface material layer is provided between the anchor material structure and the second substrate. The device further includes a sense electrode material structure (i.e., an electrostatic sense electrode material structure) that is located adjacent to, but separate from, a portion of the suspended material structure. The sense electrode structure is attached (bonded) to the electrically-conductive second substrate via an interface material layer provided between the anchor material structure and the second substrate. The device further includes first electrical electrode ohmic contacts to the anchor material structure and the sense electrode material structure, and a second electrical electrode ohmic contact to the electrically-conductive second substrate. The contacts may optionally be wire bond, flip chip, or other connections. Optionally, a spring material structure may be incorporated into the device. Such a device is shown in FIG. 1.

FIG. 1 is a side view of a hexagonal, single-crystal SiC material structure 100 formed from a first substrate 110 that is attached (bonded) to a second substrate 120, with interface material layers 131, 132 between an anchor material structure 140 and sense electrode structure 150 and the second substrate. Trenches 160 are etched in the hexagonal, single-crystal SiC first substrate to form a suspended material structure 170 with one or more attachments to the anchor material region 140 to form beams, membranes, cantilever or bridges. A hexagonal, single-crystal SiC second substrate and an N-type, epitaxial, hexagonal, single-crystal SiC first substrate are provided with second (132) and first (131) interface material layers, respectively. The first substrate may optionally be thinned to a selected thickness. The first and second interface material layers may optionally be CMP polished, and are bonded at the interface 133 between the first and second interface material layers, for example, by direct wafer bonding. The first substrate may be etched to form a movable suspended material structure having one or more attachments to an anchor material structure(s) for MEMS applications. The anchor material structure and sense electrode material structure are attached to the second substrate via the interface material layer. Preferably, the interface material is thick, and has a low dielectric constant in order to reduce capacitance. First electrical electrode ohmic contacts 181, 182 to the SiC material of the anchor material structure and sense electrode structure are provided, and a second electrical electrode ohmic contact 183 to the SiC material of the second substrate is provided. Interface material layers 131, 132 may be laterally undercut, as shown by 190.

In another embodiment, a device structure may include an anchor material structure, a sense electrode material structure, and a suspended material structure that are all formed from a hexagonal single-crystal hexagonal SiC material structure (i.e., formed from a first substrate hexagonal single-crystal SiC substrate), where the anchor material structure(s) are attached (bonded) to an interface material layer on a second substrate. The sense electrode material structure(s) are attached (bonded) to an interface material layer on the second substrate, and the suspended material structure is not attached to the second substrate. The interface material layer may be laterally undercut to facilitate the formation of the movable suspended material structures. The electrostatic sense electrode material structure capacitively senses the movement of the suspended material structure. First electrical electrode ohmic contacts can be formed on the first surface (top) of the anchor material structure and can be formed on the first surface (top) of the sense electrode material structure. A second electrical electrode ohmic contact to the second substrate can be formed on the second surface (bottom) of the second substrate or the first surface (top) of the second substrate. Optionally, a spring material structure may be incorporated into the device. Such a device is shown in FIG. 2.

Figure 2:
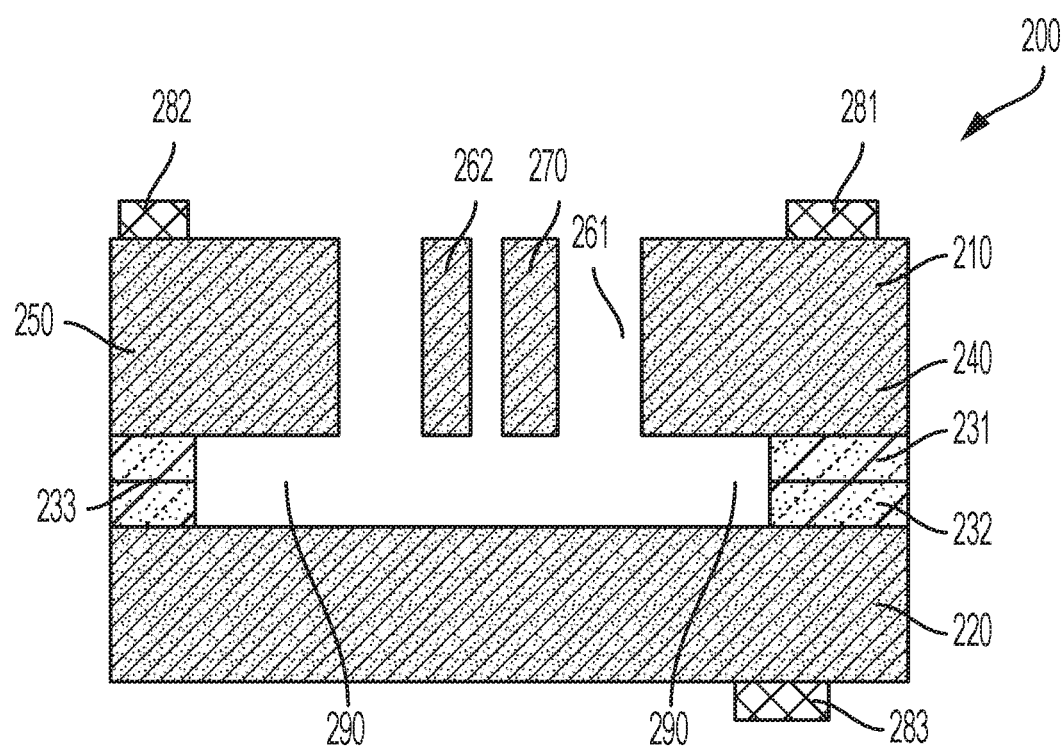
FIG. 2 is a side view of a hexagonal, single-crystal SiC device structure formed from a first substrate that is attached (bonded) to a second substrate, with an interface material layer between an anchor material structure and an electrostatic sense electrode structure and the second substrate. The suspended material structure includes one or more etched regions.

FIG. 2 is a side view of a hexagonal, single-crystal SiC material structure 200 formed from a first substrate 210 that is attached (bonded) to a second substrate 220, with interface material layers 231, 232 between an anchor material structure 240 and sense electrode structure 250 and the second substrate. Trenches 261, 262 are etched in the hexagonal, single-crystal SiC first substrate to form a suspended material structure 270 with one or more attachments to the anchor material region 240 to form beams, membranes, cantilever or bridges. A hexagonal, single-crystal SiC second substrate and an N-type, epitaxial, hexagonal, single-crystal SiC first substrate are provided with second (232) and first (231) interface material layers, respectively. The first substrate may optionally be thinned to a selected thickness. The first and second interface material layers may optionally be CMP polished, and are bonded at the interface 233 between the first and second interface material layers, for example, by direct wafer bonding. The first substrate may be etched to form a movable suspended material structure having one or more attachments to an anchor material structure(s) for MEMS applications. The anchor material structure and sense electrode material structure are attached to the second substrate via the interface material layer. Preferably, the interface material is thick, and has a low dielectric constant in order to reduce capacitance. The suspended material structure 270 includes one or more etched regions 262 to facilitate lateral undercutting 290 of the interface material layers 231, 232 under the large-width suspended material structure. First electrical electrode ohmic contacts 281, 282 to the SiC material of the anchor material structure and sense electrode structure are provided, and a second electrical electrode ohmic contact 283 to the SiC material of the second substrate is provided.

In some embodiments, the second substrate may be an electrically conductive N-type hexagonal single-crystal SiC second substrate or an electrically conductive P-type hexagonal single crystal second substrate. In other embodiments, the electrically conductive second substrate material may include, but is not limited to, an electrically conductive semiconductor substrate, an electrically conductive silicon substrate, an electrically conductive ceramic substrate, or an electrical conductive polycrystalline substrate.

In additional embodiments, the movable suspended material structure(s) comprising hexagonal single-crystal SiC material that is attached to an anchor material structure that is attached (bonded) to a second substrate with a silicon oxide interface material layer between the anchor material structure and that second substrate that is further laterally undercut to form a movable suspended material structure beam and further includes a electrostatic sense electrode material structure that is located adjacent to but separate from a portion of the suspended material structure with the electrostatic sense electrode structure attached (bonded) to a second substrate with a silicon oxide interface material layer between the anchor material structure and that second substrate that is further laterally undercut to form a movable suspended material structure beam and reduce the capacitance of the sense electrode.

In some embodiments, a hexagonal single-crystal SiC suspended material structure, anchor material structure, and sense electrode structure (formed from a first hexagonal single-crystal SiC substrate) can have a first surface (top) that is a carbon-face surface and a second surface (bottom) that is a silicon-face surface. In some embodiments, a hexagonal single-crystal SiC suspended material structure, anchor material structure, and sense electrode structure (formed from a second substrate) can have a first surface (top surface) that is a silicon-face surface and a second surface (bottom surface) that is a carbon-face surface. The first surface of the second substrate will typically be a silicon-face surface.

In other embodiments, one or more than one suspended material structure(s) that comprise a hexagonal single-crystal silicon carbide (SiC) material layer (having a first surface and a second surface) are attached (fixed) to one or more than one hexagonal single-crystal SiC anchor material structures that are attached to a second substrate with an interface material layer between the anchor material structure and the second substrate. In addition, an electrostatic sense electrode material structure is located adjacent to, but separate from, a portion of the suspended material structure. The sense electrode structure is attached to a second substrate with an interface material layer between the anchor material structure and the second substrate. The electrostatic sense electrode material structure capacitively senses the movement of the suspended material structure.

In further embodiments, the anchor material structure, the sense electrode material structure, and the suspended material structure are formed from a continuous single-crystal hexagonal SiC material structure and the anchor material structure(s) is bonded (attached) to an interface material layer on the electrically conductive second substrate, the sense material structure(s) are bonded (attached) to an interface material layer on the electrically conductive second substrate, and the suspended material structure is not attached to the second substrate. The interface material layer may be laterally undercut to facilitate the formation of the movable suspended material structures. A first electrical electrode ohmic contact to the hexagonal single-crystal SiC material structure can be formed on the first surface (top) of the anchor material structure. A second electrical electrode ohmic contact to the second substrate can be formed on the second surface (bottom) of the second substrate or the first surface (top) of the second substrate.

Electromechanical Structures without Sense Electrode

In one embodiment, one or more than one hexagonal single-crystal SiC suspended material structure(s) are attached to one or more than one hexagonal single-crystal SiC anchor material structures that are attached (bonded) to an electrically conductive second substrate with an interface material layer between the anchor material structure and the second substrate with an interface material layer between the anchor material structure and the second substrate and further including a first electrical electrode ohmic contact to the anchor material structure and a second electrical electrode ohmic contact to the electrically conductive second substrate. Optionally, a spring material structure may be incorporated into the device. Such a device is shown in FIG. 3.

Figure 3:
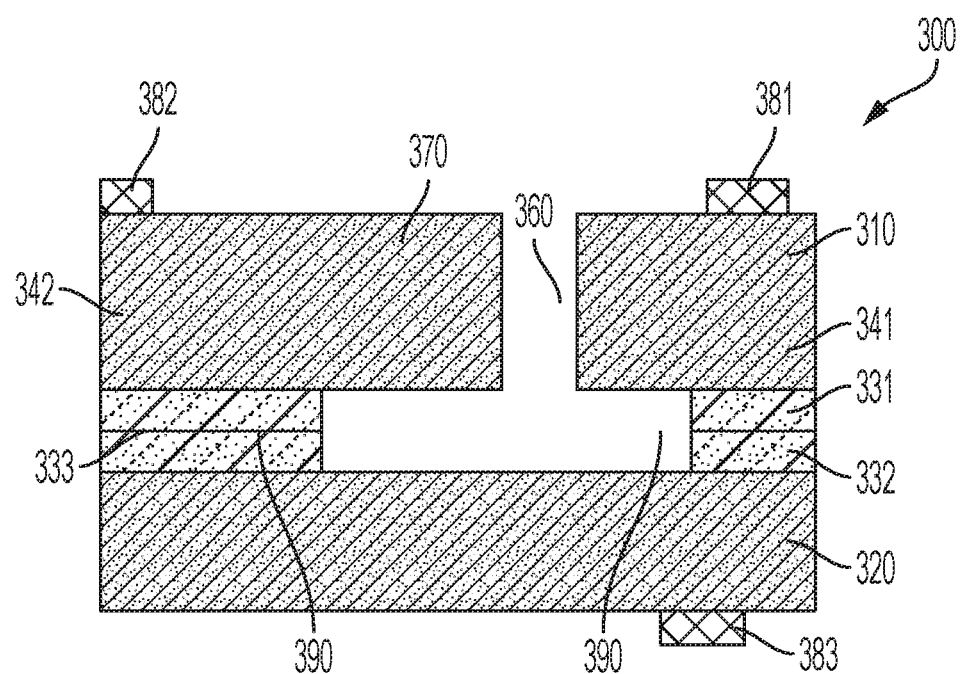
FIG. 3 is a side view of a hexagonal, single-crystal SiC device structure formed from a first substrate that is attached (bonded) to a second substrate, with an interface material layer between anchor material structures and the second substrate.
Figure 4A:
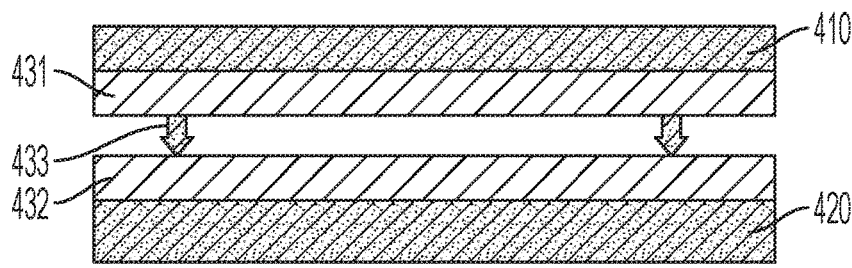
FIGS. 4A-4D illustrate steps for forming an electromechanical device structure incorporating a movable suspended material structure using the methods of the invention.
Figure 4B:
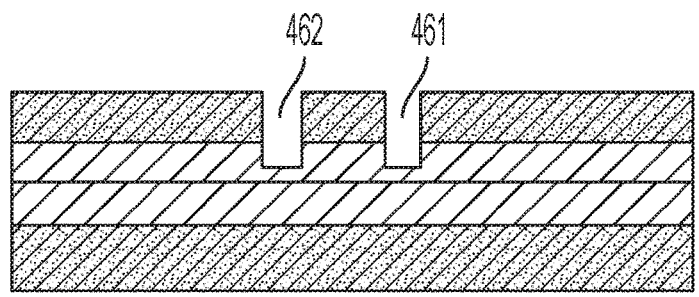
Figure 4C:
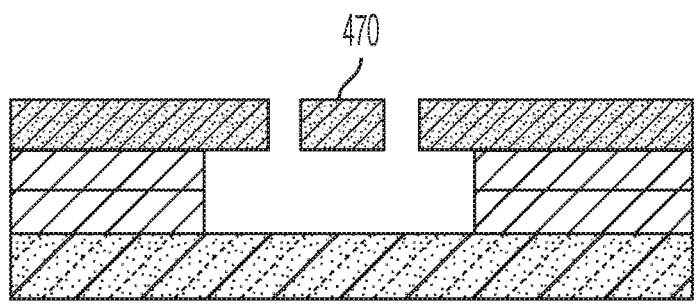
Figure 4D:
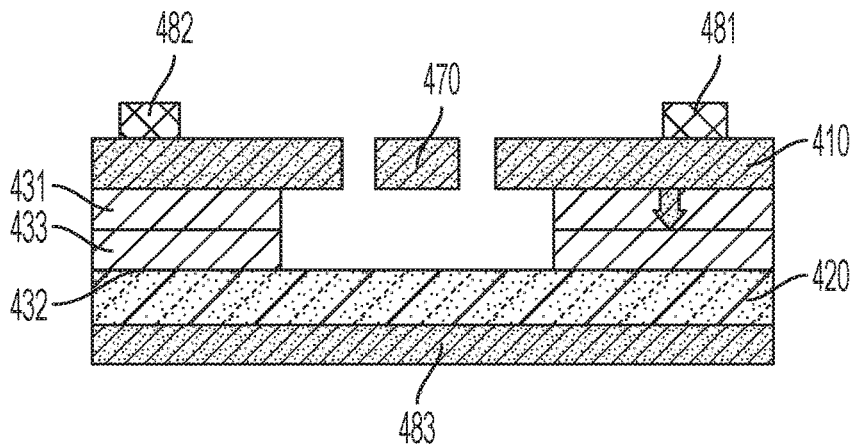

FIG. 3 is a side view of a hexagonal, single-crystal SiC material structure 300 formed from a first substrate 310 that is attached (bonded) to a second substrate 320, with interface material layers 331, 332 between anchor material structures 341, 342 and the second substrate. A trench 360 is etched in the hexagonal, single-crystal SiC first substrate to form a suspended material structure 370 with one or more attachments to the anchor material regions 341, 342 to form beams, membranes, cantilever or bridges. A hexagonal, single-crystal SiC second substrate and an N-type, epitaxial, hexagonal, single-crystal SiC first substrate are provided with second 332 and first 331 interface material layers, respectively. The first substrate may optionally be thinned to a selected thickness. The first and second interface material layers may optionally be CMP polished, and are bonded at the interface 333 between the first and second interface material layers, for example, by direct wafer bonding. The first substrate may be etched to form a movable suspended material structure having one or more attachments to anchor material structure(s) for MEMS applications. The anchor material structures are attached to the second substrate via the interface material layer. First electrical electrode ohmic contacts 381, 382 to the SiC material of the anchor material structures are provided, and a second electrical electrode ohmic contact 383 to the SiC material of the second substrate is provided.

In another embodiment, the anchor material structure and the suspended material structure are formed from a hexagonal single-crystal hexagonal SiC material structure (i.e., formed from a first substrate hexagonal single-crystal SiC substrate) and the anchor material structure(s) is attached (bonded) to an interface material layer on the second substrate and the suspended material structure is not attached to the second substrate. The interface material layer may be laterally undercut to facilitate the formation of the movable suspended material structures. First electrical electrode ohmic contacts can be formed on the first surface (top) of the anchor material structure. A second electrical electrode ohmic contact to the second substrate can be formed on the second surface (bottom) of the second substrate or the first surface (top) of the second substrate. Optionally, a spring material structure may be incorporated into the device.

In some embodiments, the second substrate may be an electrically conductive N-type hexagonal single-crystal SiC second substrate, or an electrically conductive P-type hexagonal single crystal second substrate. In other embodiments, the electrically conductive second substrate material may include but not be limited an electrically conductive semiconductor substrate, an electrically conductive silicon substrate or an electrically conductive ceramic substrate or an electrically conductive polycrystalline substrate.

In further embodiments, the movable suspended material structure(s) comprising hexagonal single-crystal SiC material that is attached to an anchor material structure that is attached (bonded) to a second substrate with a silicon oxide interface material layer between the anchor material structure and that second substrate that is further laterally undercut to form a movable suspended material structure beam.

A microelectromechanical (MEMS) device may be configured as a resonator that is used in timing devices. The resonator may have a variety of physical shapes, such as beams or plates. The MEMS device may have a suspended material structure that is suspended and freely movable relative to the second substrate, but also attached to the second substrate via an anchor material structure. The suspended material structure may be a feature such as, but not limited to, a beam, a plate, a cantilever arm, or a tuning fork. In a specific embodiment, a MEMS device includes a resonating feature (e.g., suspended mass) flanked by one or more drive electrodes and one or more sense electrode material structures.

Methods

The methods of the invention for forming the electromechanical device structures (including, but not limited to, MEMS and NEMS) of the invention include providing an interface material layer on one or both of the first and second substrates, bonding the interface materials to the opposing first or second substrate or to the other interface material layer, followed by forming the suspended material structure by etching. Electrical contacts may then be applied to the structure.

Wafer Bonding

Bonding approaches for bonding the SiC material that will attach the anchor material structures to the second substrate include but are not limited to direct wafer bonding, fusion bonding, laminating, anodic bonding, polymer bonding, metal to metal bonding, metallic-alloy bonding, metallic liquid phase bonding, or glass-frit bonding. It is desirable that the bonding be performed at the wafer level for economic consideration, but could be performed at the die level.

Direct wafer bonding can be used if the surface roughness of the two surface to be bonded is less than about 0.5 nm RMS. Plasma-activated (or plasma-assisted) wafer surfaces to be bonded can be used to improve the direct wafer bonding process. One advantage of plasma activated wafer bonding is that high mechanical strength wafer bonds can be formed at low temperature, and that hydrogen is removed from the wafer surface. The removal of hydrogen in the plasma-activated process allows direct wafer bonding of a single-crystal SiC wafer surface to a second single-crystal SiC wafer surface without an interface material layer. The direct wafer bonding of a SiC surface to another SiC surface provides high mechanical strength, high thermal conductivity across the bond interface, and allows high processing temperature such as 1500° C. in some embodiments, or 1800° C. in other embodiments. Both hydrophilic and hydrophobic surfaces can be direct wafer bonded; however, hydrophilic surfaces have fewer issues such as hydrogen bubble formation, which is common for hydrophobic wafer bonding. The wafer bonding can be performed at room temperature or at elevated temperatures. An anneal in the range of about 400° C. to 1200° C. can increase the wafer bond strength.

It can be desirable to have a silicon oxide layer on the surface of the SiC material layers prior to direct wafer bonding. The silicon oxide layer can absorb hydrogen that on the material surfaces, and reduce the incidence of hydrogen bubble formation at the wafer bond interface during wafer bonding. In some embodiments, a silicon oxide thickness of more than about 10 nm can be desirable to absorb the hydrogen. In some embodiments, a silicon oxide thickness of more than about 40 nm can be desirable to absorb the hydrogen. Thicker silicon oxide layers can also be used for absorbing the hydrogen and lateral etching for an undercut approach.

It is desirable that the silicon oxide be grown by a thermal oxidation process to minimize hydrogen in the silicon oxide layer. It can be desirable to anneal silicon oxide that is grown by Plasma-Enhanced Chemical Vapor Deposition (PECVD), Low-Pressure Chemical Vapor Pressure (LPCVD), or Chemical Vapor Deposition (CVD) at temperatures of about 1000° C. to minimize the hydrogen in the silicon oxide layers.

An advantage of an LPCVD silicon nitride material layer is that the material will have low hydrogen content. PECVD silicon nitride has a high hydrogen content, and it is desirable to anneal to remove the hydrogen prior to direct wafer bonding. It is often desirable to chemically or mechanically polish the CVD, PECVD, or LPCVD surface to reduce the surface roughness to less than 0.5 nm RMS to facilitate direct wafer bonding.

Non-vacuum bonding, moderate vacuum bonding ($1\times10^{-6}$ torr), or UHV vacuum bonding (about $1\times10^{-9}$ torr) bonding can be used. A significant advantage of vacuum bonding is that vacuum bonding enables a direct wafer bond of SiC material to SiC material. One advantage of a SiC-to-SiC wafer is that extremely high temperature processes are enabled with a SiC-to-SiC wafer bond. For example, oxidation temperature of 1100° C. of higher, or dopant anneal temperatures of 1500° C. or higher, or dopant anneal temperatures of 1800° C. or higher are enabled by a SiC-to-SiC wafer bond. Silicon oxide interface material(s) permit a maximum process temperature of about 1350° C. to 1450° C. after the direct wafer bond. Silicon nitride interface material(s) permit a maximum process temperature of about 1500° C. to 1600° C. after the direct wafer bond. Polymer bonding is low cost, but can result in increased damping.

Thinning of Hexagonal Single-Crystal SiC Material

After wafer bonding of the hexagonal single-crystal SiC material first substrate (with an interface material layer) to the second substrate (with interface material layer), the hexagonal single-crystal SiC material that is used to form the suspended material structure, the anchor material structure, and the sense electrode material structure can be thinned to a selected thickness by a combination of grinding, mechanical polishing, CMP polishing, and/or RIE etching. The selected thickness of the hexagonal single-crystal material used to form the suspended material structure can be for example 1 micron thick, 2 micron thick, 4 micron thick, 10 micron thick, 20 micron thick, 40 micron thick, 100 micron thick, 200 micron thick, or 500 micron thick. One approach to reduce the residual stress and subsurface damage at the first surface of the suspended material structure of the thinning operation is to use a stress release chemical mechanical polish (CMP) and/or a plasma etch process.

Deep Trench SiC Etching

A deep trench etch entirely through the thickness of the N-type hexagonal single-crystal layer can be performed, for example, by ICP-RIE SiC etching using gases such as $SF_6$ plus argon, oxygen, or other gases, in order to form movable suspended material structures above the recesses.

Undercutting Interface Material Layers

The interface material layers can be laterally undercut to enable a movable suspended material structure using processes such as HF vapor etching, anhydrous HF vapor etching, and wet chemical dilute HF etching for the case of silicon oxide interface material layer. The interface material layers can optionally be laterally undercut to enable a movable suspended material structure using processes such as xenon difluoride ($XeF_2$) or wet chemical etch in the case of polysilicon. In the case that a liquid chemical etch process is used to undercut the interface material layer, it is desirable to use critical point drying to prevent stiction where the suspended beam structure and attach to the second substrate and no longer be freely moving.

For suspended beam structures with a width larger than about 20 microns, one or more than on etched regions can be formed in the suspended material structure to facilitate lateral undercut of the large width suspended material structures to enable release of the suspended material structure from the second substrate (and interface material layer).

EXAMPLES

The invention will now be particularly described by way of example. However, it will be apparent to one skilled in the art that the specific details are not required in order to practice the invention. The following descriptions of specific embodiments of the present invention are presented for purposes of illustration and description. They are not intended to be exhaustive of or to limit the invention to the precise forms disclosed. Many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated.

Example 1

In this exemplary method, metal electrode ohmic contacts are formed on the first surface of the anchor material structure and the sense electrode material structure. The method is illustrated in FIGS. 4A-4D.

1. An N-type 6H-SiC or 4H-SiC single-crystal first substrate 410 is provided.

2. Optionally thin and polish the N-type 6H-SiC or 4H-SiC single-crystal first substrate to a low total thickness variation (TTV) and to a selected thickness. The total thickness variation can be as small as about 1 micron in some embodiment, 2 microns in some embodiments, 3 microns in some embodiment and 5 microns in some embodiments. The accuracy of the selected thickness can be about 1 micron in some embodiments, 2 microns in some embodiments, 3 microns in some embodiment and 5 microns in some embodiments.

3. Deposit or grow a first dielectric interface material layer 431 on the second (lower) surface of the first substrate. In some embodiments, the first dielectric material layer may be a silicon oxide layer. Optionally anneal the first dielectric layer at about 1000° C. in an ambient atmosphere of oxygen or nitrogen to densify the silicon oxide layer and reduce the amount of hydrogen atoms within the silicon oxide layer. Chemically or mechanically polish the surface of the first dielectric layer to a surface roughness less than about 0.5 nm root mean square.

4. Deposit or grow a second dielectric interface material layer 432 on the first (upper) surface of a second substrate 420. In some embodiments, the first dielectric material layer may a silicon oxide layer. Optionally anneal the first dielectric layer at about 1000° C. in an ambient of oxygen or nitrogen to densify the silicon oxide layer and reduce the amount of hydrogen atoms within the silicon oxide layer. Chemically or mechanically polish the surface of the first dielectric layer to a surface roughness less than about 0.5 nm root mean square.

5. Photolithography step 1: Photodefine RIE etch protect material layer. The RIE etch protect layer is a material layer that has a slow etch rate in the SiC RIE etch gases. The RIE etch protect layer may include but not be limited to nickel metal layer, aluminum metal layer, indium tin oxide material layer, and an aluminum nitride material layer. The RIE etch protect layer can be an electrical electrode.

6. Direct wafer bond 433 (fusion bond) the first (upper) surface of the second interface material layer (formed on the second substrate) to second (lower) surface of the first interface material layer (formed on the second surface of second hexagonal single-crystal SiC substrate). The surfaces of the silicon oxide interface material layers may be activated prior to wafer bonding by plasma activation and/or chemical activation. The direct wafer bonding process may be a non-vacuum direct wafer bond process, a vacuum direct wafer bonding process, or a UHV vacuum direct wafer bonding process. See FIG. 4A.

7. Anneal at temperatures in the range of about room temperature to about 1100° C. to increase the bond strength of the direct wafer bonded region.

8. Thin the first surface of the N-type doped hexagonal single-crystal SiC material second substrate to a thickness in the range of about 2 microns to about 200 micron final thickness and perform a CMP polish for stress reduction and removal of subsurface damage. The process of thinning may include grinding, mechanical polishing and chemical mechanical polishing (CMP). The process of CMP polishing as a final polishing step is desirable to reduce mechanical stress, surface damage, and grinding damage, at the first surface of the second substrate and within the thinned first substrate.

9. Photolithography step 2: Photodefine a metal layer that makes ohmic contact to first surface of the thinned N-type hexagonal single-crystal SiC first surface. A thin titanium layer (about 10 nm) and a nickel layer about 100 nm thick can be used to make an ohmic contact to the first surface of the N-type hexagonal single-crystal SiC material layer after heat-treatment.

10. Photolithography step 3: Photodefine a gold layer 300 nm or thicker that can facilitate the wire bonding to the metal on the first surface of the N-type hexagonal single-crystal SiC material layer.

11. Photolithography step 4: Photodefine a protect layer material layer that protects the metal for the ohmic contact to the first surface of the N-type hexagonal single-crystal SiC material layer. The protect layer material may be gold or another material resistant to the chemicals used in subsequent steps.

12. Photolithography step 5: Photodefine a material layer that performs as a RIE etch definition layer for the SiC trench etch on the first surface of the N-type hexagonal single-crystal SiC. The RIE etch definition masking layer that defines where SiC will be etched can be a nickel layer, an aluminum layer, an aluminum nitride layer, or an indium thin oxide layer, or combinations thereof. The nickel layer can be formed by electroplating nickel inside of a photodefined resist mode or deposition of nickel and a resist or dielectric masking layer followed by a subtractive etch using ion beam milling or plasma etching. Nickel can also be etched by chemical etching. The aluminum layer can be subtractive etched by RIE plasma etch.

13. Perform the ICP-RIE SiC trench etch entirely through the thickness of the N-type hexagonal single-crystal thinned first substrate 410 using gases such $SF_6$ plus argon, oxygen, or other gases, forming trenches 461, 462. See FIG. 4B.

14. Laterally undercut the interface material layer(s) 431, 432 to form movable suspended material structures 470 above the recesses. The lateral undercut can be performed using gases comprising vapor HF or anhydrous vapor HF, or chemical etch comprising HF. See FIG. 4C.

15. Remove the nickel masking layer.

16. Optionally perform critical point drying to prevent stiction.

17. Separate, die-bond, and wire-bond (see contacts 481, 482, 483) to MEMS die. See FIG. 4D.

Example 2

In this exemplary method, a MEMS gyroscope device is fabricated. The method is illustrated in FIGS. 5A-5E.

1. Oxidized wafers (e.g., on-axis n+ SiC active wafer 510 with TEOS oxide coating and n+ SiC carrier substrate wafer 520 with TEOS oxide coating) are bonded to create a silicon carbide on insulator (SiCOI) wafer. No recess etching or metallization is performed before the oxide wafers are bonded. See FIG. 5A.

2. The active wafer 510 is thinned to 40 microns without forming recesses in the carrier substrate, and contacts 580 are formed. See FIG. 5B.

3. A patterned integral etch mask 540 (thick plated nickel) is formed. See FIG. 5C.

Figure 5A:
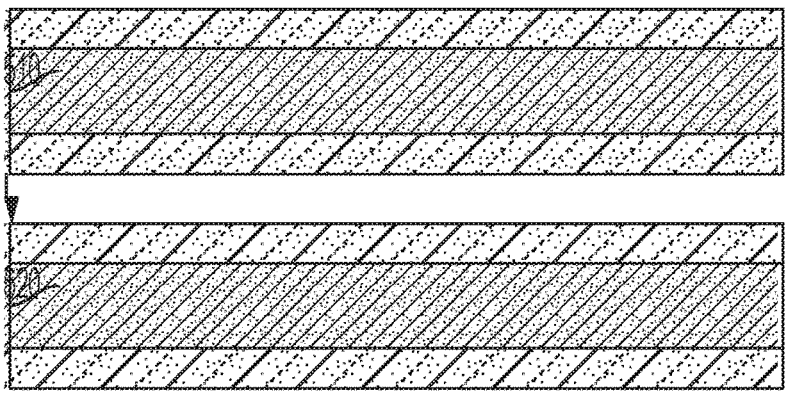
FIGS. 5A-5E illustrate steps for forming a gyroscope MEMS device structure using the methods of the invention.
Figure 5B:
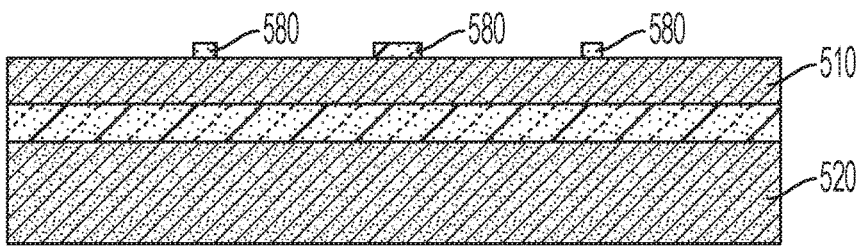
Figure 5C:
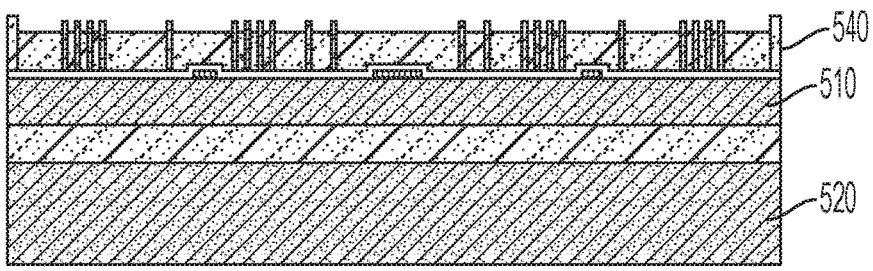
Figure 5D:
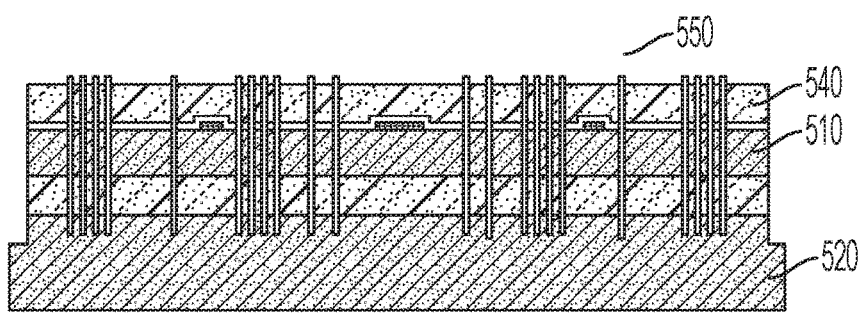
Figure 5E:
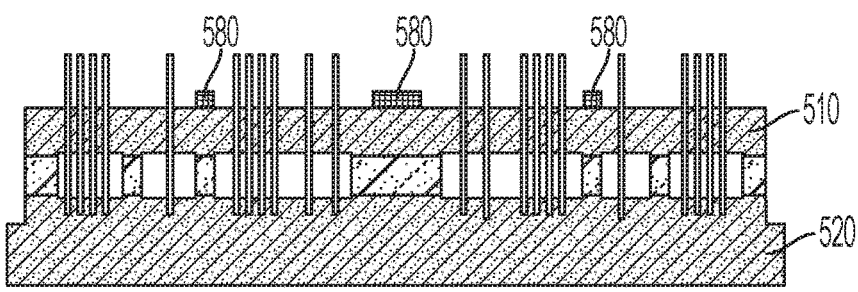
Figure 6:
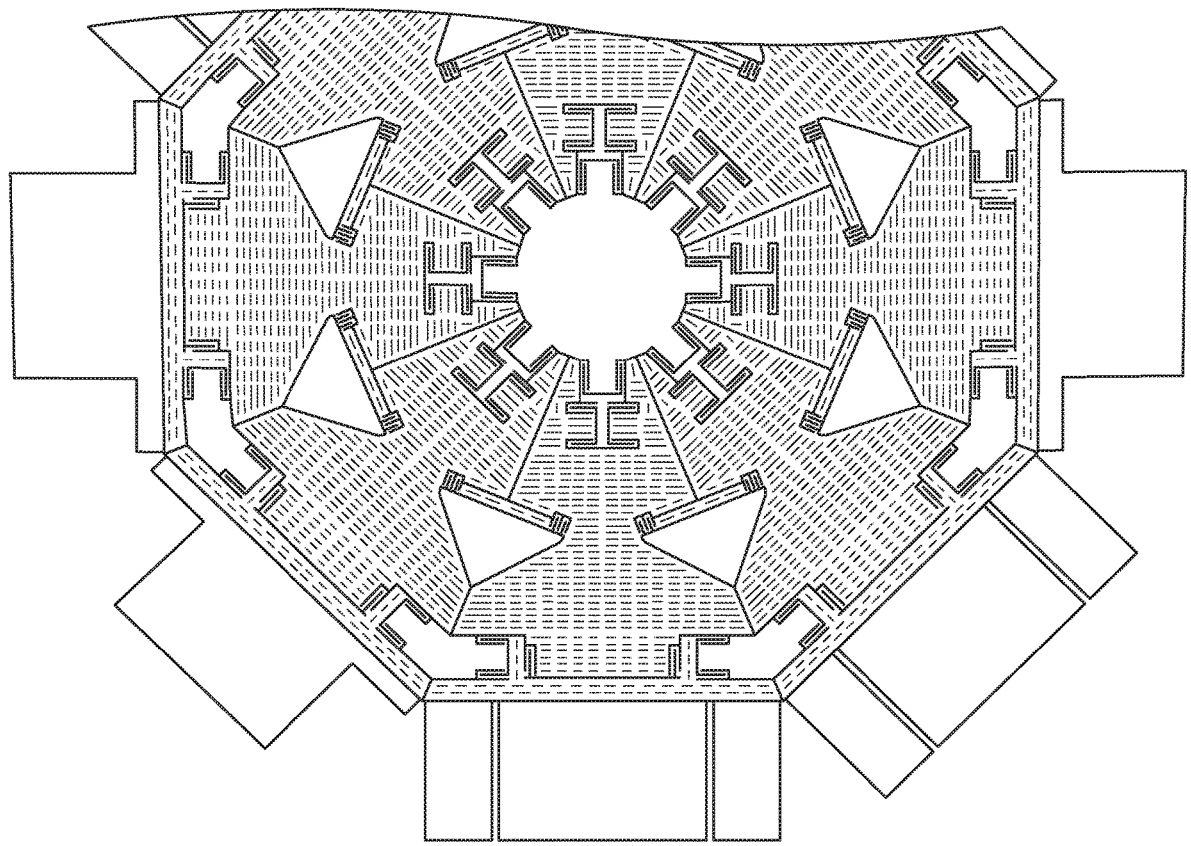
FIG. 6 is a drawing of a gyroscope pattern used to form a gyroscope MEMS device structure.

4. The gyroscope pattern 550 is deep etched through the 40 micron active wafer 510 and into the thick oxide layer, and the gyroscope pattern is subsequently released by removal of $SiO_2$, as shown in FIG. 5E. See FIG. 5D. A portion of the gyroscope pattern is shown in FIG. 6.

5. The etch mask is removed, then HF vapor is used to complete the release step. See FIG. 5E.

It will, of course, be appreciated that the above description has been given by way of example only and that modifications in detail may be made within the scope of the present invention.

Throughout this application, various patents and publications have been cited. The disclosures of these patents and publications in their entireties are hereby incorporated by reference into this application, in order to more fully describe the state of the art to which this invention pertains.

The invention is capable of modification, alteration, and equivalents in form and function, as will occur to those ordinarily skilled in the pertinent arts having the benefit of this disclosure. While the present invention has been described with respect to what are presently considered the preferred embodiments, the invention is not so limited. To the contrary, the invention is intended to cover various modifications and equivalent arrangements included within the spirit and scope of the description provided above.

What is claimed:

1. An electromechanical device, comprising:
   a first substrate comprising silicon carbide, wherein the first substrate comprises an anchor material structure and a movable suspended material structure, the movable suspended material structure being separated from the anchor material structure by a trench on at least one side of the anchor material structure, the trench having a sidewall angle with respect to the first substrate between 3 and 15 degrees and a width of about 0.5 microns to about 8 microns;
   a second substrate; and
   at least one electrically insulating and thermally conducting interface material layer disposed between the anchor material structure and the second substrate;

wherein the width of the trench and the sidewall angle of the trench region are configured to provide a predetermined extent of electrostatic coupling between the suspended material structure and the anchor material structure.

2. The electromechanical device of claim 1, wherein the first substrate further comprises a sense electrode structure.

3. The electromechanical device of claim 1, wherein the first substrate is more than about 2 micron thick.

4. The electromechanical device of claim 1, wherein the interface material layer is more than about 1 micron thick.

5. The electromechanical device of claim 1, wherein the first substrate has a residual stress less than about 20 MPa.

6. The electromechanical device of claim 1, wherein the first substrate is electrically conductive.

7. The electromechanical device of claim 1, wherein the first substrate further comprises a spring material structure connecting the anchor material structure to the suspended material structure.

8. The electromechanical device of claim 2, wherein the interface material layer reduces the capacitance between the sense electrode structure and the second substrate to about 5 pF.

9. The electromechanical device of claim 1, wherein the second substrate comprises a material selected from the group consisting of electrically-conductive silicon carbide, silicon, glass, and ceramic.

10. The electromechanical device of claim 1, wherein the interface material layer comprises an insulating material selected from the group consisting of silicon oxide, silicon nitride, polysilicon, glass, polymer, and combinations thereof.

11. The electromechanical device of claim 1, wherein the interface material layer comprises two wafer-bonded interface material layers.

12. The electromechanical device of claim 1, wherein the first substrate comprises silicon carbide selected from the group consisting of bulk hexagonal single-crystal SiC, epitaxial hexagonal single-crystal SiC, hexagonal single-crystal 6H-SiC, N-type hexagonal single-crystal 6H-SiC, P-type hexagonal single-crystal 6H-SiC, hexagonal single-crystal 4H-SiC, N-type hexagonal single-crystal 4H-SiC, and P-type hexagonal single-crystal 4H-SiC.

13. The electromechanical device of claim 1, wherein the first substrate comprises hexagonal single-crystal silicon carbide substrate with less than about 2 degrees offset orientation from the c-axis.

14. The electromechanical device of claim 1, wherein the first substrate material is the same as the second substrate material.

15. The electromechanical device of claim 1, wherein the first substrate material and the second substrate material are different, and have linear coefficients of thermal expansion that are within about 10% of one another.

16. The electromechanical device of claim 1, wherein the suspended material structure is selected from the group consisting of beams, membranes, cantilevers, bridges, plates, and tuning forks.

17. The electromechanical device of claim 1, wherein the device is selected from the group consisting of a gyroscope, an accelerometer, an oscillator, and an inertial sensor.

18. The electromechanical device of claim 1, further comprising one or more ohmic contacts provided on the anchor material structure and second substrate.

* * * * *